United States Patent
Hada et al.

(10) Patent No.: US 7,316,885 B2
(45) Date of Patent: Jan. 8, 2008

(54) METHOD OF FORMING RESIST PATTERN, POSITIVE RESIST COMPOSITION, AND LAYERED PRODUCT

(75) Inventors: Hideo Hada, Kawasaki (JP); Miwa Miyairi, Kawasaki (JP); Naotaka Kubota, Kawasaki (JP); Takeshi Iwai, Kawasaki (JP)

(73) Assignee: Tokyo Ohka Kogyo Co., Ltd, Kawasaki-shi (JP)

( * ) Notice: Subject to any disclaimer, the term of this patent is extended or adjusted under 35 U.S.C. 154(b) by 233 days.

(21) Appl. No.: 10/535,533

(22) PCT Filed: Dec. 1, 2003

(86) PCT No.: PCT/JP03/15347

§ 371 (c)(1),
(2), (4) Date: May 19, 2005

(87) PCT Pub. No.: WO2004/051372

PCT Pub. Date: Jun. 17, 2004

(65) Prior Publication Data

US 2006/0154181 A1   Jul. 13, 2006

(30) Foreign Application Priority Data

Dec. 2, 2002   (JP)   ............... 2002-350353

(51) Int. Cl.
*G03F 7/004* (2006.01)
*G03F 7/30* (2006.01)

(52) U.S. Cl. .................. 430/270.1; 430/326; 430/330; 430/905; 430/910

(58) Field of Classification Search ............ 430/270.1, 430/905, 910, 326, 330
See application file for complete search history.

(56) References Cited

U.S. PATENT DOCUMENTS

2001/0026901 A1   10/2001   Maeda et al.
2004/0058269 A1   3/2004   Hada et al.
2004/0110085 A1   6/2004   Iwai et al.

FOREIGN PATENT DOCUMENTS

| EP | 1152036 A1 | 11/2001 |
| EP | 1 260 864 A1 | 11/2002 |
| EP | 1273974 A2 | 1/2003 |
| JP | 01-307228 | 12/1989 |
| JP | 04-364021 | 12/1992 |
| JP | 05-166717 | 7/1993 |
| JP | 05-241348 | 9/1993 |
| JP | 2000-330287 | 11/2000 |
| JP | 2002 040661 A | 2/2002 |
| JP | 2002-162745 | 6/2002 |
| WO | WO 03/048861 A1 | 6/2003 |
| WO | WO 03/048863 A1 | 6/2003 |

OTHER PUBLICATIONS

International Search Report from PCT priority application No. PCT/JP2003/015347, filed Dec. 1, 2003.

*Primary Examiner*—John S. Chu
(74) *Attorney, Agent, or Firm*—Knobbe Martens Olson & Bear LLP

(57) ABSTRACT

There are provided a method of forming a resist pattern that enables the resist pattern to be formed with good control of the pattern size, as well as a positive resist composition used in the method, and a layered product formed using the positive resist composition. In the above method a positive resist composition comprising a resin component (A), which contains a structural unit (a1) derived from a (meth)acrylate ester represented by a general formula (I) shown below, and displays increased alkali solubility under action of acid, and an acid generator component (B) that generates acid on exposure is applied to a substrate, a prebake is conducted, the resist composition is selectively exposed, post exposure baking (PEB) is conducted, alkali developing is then used to form a resist pattern, and the pattern size of the thus produced resist pattern is then narrowed by heat treatment.

16 Claims, 2 Drawing Sheets

METHOD OF FORMING RESIST PATTERN, POSITIVE RESIST COMPOSITION, AND LAYERED PRODUCT

This application is the U.S. National Phase under 35 U.S.C. 371 of International Application PCT/JP2003/015347, filed Dec. 1, 2003, which claims priority to Japanese Patent Application No. 2002-350353, filed Dec. 2, 2002. The International Application was published under PCT Article 21(2) in English.

TECHNICAL FIELD

The present invention relates to a method of forming a resist pattern, comprising a step for narrowing the pattern size of the resist pattern by conducting a heat treatment following formation of the resist pattern, as well as a positive resist composition that is ideally suited to use within such a method, and a layered product that uses such a positive resist composition.

BACKGROUND ART

In recent years, in the manufacture of semiconductor elements and the like, advances in lithography techniques have lead to rapid progress in the field of miniaturization. Typically these miniaturization techniques involve shortening of the wavelength of the exposure light source. Until recently, ultraviolet radiation such as g-lines and i-lines have been used as the exposure light source, but recently, KrF excimer lasers (248 nm) have been introduced, and even ArF excimer lasers (193 nm) are now starting to be used.

Resists for use with light sources such as KrF excimer lasers and ArF excimer lasers require a high resolution capable of reproducing a pattern of minute dimensions, as well as good sensitivity relative to light sources with this type of short wavelength. One example of a type of known resist that satisfies these conditions is a chemically amplified positive type resist composition comprising a base resin that displays increased alkali solubility under the action of acid, and an acid generator that generates acid on exposure (see patent reference 1)

In the reaction mechanism of a chemically amplified resist, exposure causes the acid generator within the resist to generate acid, and this acid causes a change in the solubility of the resin. For example, if a dissolution inhibiting group that dissociates in the presence of acid is introduced into the resin, then this dissolution inhibiting group will dissociate only within the exposed sections of the resist, causing a significant increase in the solubility of the resist in the developing liquid within these exposed sections. Typically the dissociation reaction of the dissolution inhibiting group is accelerated by conducting a post exposure baking (PEB) treatment. Furthermore, the PEB treatment also promotes the diffusion of acid within the resist, meaning a much higher sensitivity can be achieved than with conventional non-chemically amplified resists.

In KrF excimer laser lithography, polyhydroxystyrenes or derivatives thereof in which the hydroxyl groups are protected with an acid dissociable, dissolution inhibiting group, which display high transparency relative to a KrF excimer laser (248 nm), have been used as the base resin component of chemically amplified resists. However, these resins display unsatisfactory transparency near 193 nm, and are essentially unusable for ArF excimer laser lithography. Accordingly, current base resins for ArF resists utilize a (meth)acrylic polymer comprising, as an acid dissociable, dissolution inhibiting group, an aliphatic polycyclic hydrocarbon group with a polycyclic skeleton such as an adamantane structure, and with a tertiary carbon atom within this skeleton.

In recent years the degree of miniaturization has progressed rapidly, and nowadays, resolutions capable of generating line and space patterns of less than 100 nm and isolated patterns of no more than 70 nm are being sought. As a result, in addition to the research and development being conducted on resist materials to enable ultra-miniaturization, research is also being conducted on pattern formation methods to develop techniques capable of overcoming the resolution limits of resist materials.

One example of such a technique, which has resulted in a number of different proposals, is a method in which a resist pattern is first formed using photolithography, and subsequent heat treatment is then used to further reduce the size of the resist pattern.

For example, the patent reference 2 discloses an omission pattern formation method in which an omission pattern is first formed in a pattern formation resist applied to the surface of a substrate, a mixing generation resist that mixes with the pattern formation resist is then applied across the entire surface of the substrate, baking is performed so that a mixed layer is formed on the side walls and the surface of the pattern formation resist, and the unmixed sections of the mixing generation resist are then removed, enabling the pattern size to be reduced by the dimensions of the mixed layer.

Furthermore, the patent reference 3 discloses a pattern formation method in which a resist pattern comprising an acid generator is formed on a substrate, the entire surface of the substrate is coated with a resin that becomes insoluble in the presence of acid, a heat treatment is then conducted, causing acid to diffuse from the resist into the resin, forming a resist layer of uniform thickness at the interface between the resin and the resist pattern, and developing is then used to remove those sections of the resin into which the acid has not diffused, thereby enabling the pattern size to be reduced by the dimension of the aforementioned uniform thickness.

Furthermore, recently, thermal flow processes in which the resist pattern is fluidized through heat treatment or the like, thereby enabling a reduction in the pattern size, have also been proposed. In a thermal flow method, a resist pattern is first formed using photolithography, and by subsequently heating the pattern to a temperature exceeding the glass transition temperature (Tg) of the resin component within the resist layer, thereby softening the resist, the size of the resist pattern is reduced.

For example, the patent reference 4 discloses a method of forming a fine pattern in which a resist pattern is formed on a substrate, heat treatment is conducted, and the cross sectional shape of the resist pattern is changed from a rectangular shape to a semicircle, thereby increasing the length of the base and forming a finer pattern.

Furthermore, the patent reference 5 discloses a method of forming a fine pattern in which following formation of a resist pattern, heating is conducted to approximately the softening temperature of the resist pattern, and fluidization of the resist causes a narrowing of the pattern size.

(Patent Reference 1)

Japanese Unexamined Patent Application, First Publication No. 2002-162745

(Patent Reference 2)

Japanese Unexamined Patent Application, First Publication No. Hei 5-166717

(Patent Reference 3)
Japanese Unexamined Patent Application, First Publication No. Hei 5-241348
(Patent Reference 4)
Japanese Unexamined Patent Application, First Publication No. Hei 1-307228
(Patent Reference 5)
Japanese Unexamined Patent Application, First Publication No. Hei 4-364021

As described above, in those cases where heat treatment is performed on the resist following resist pattern formation (and following developing), the pattern size of the resist pattern, namely, the size of the sections in which the resist is not formed (such as the hole diameter within a hole pattern or the space width within a line and space (L&S) pattern) reduces relative to the size prior to the heat treatment. In such cases, if a conventional ArF resist is used, the degree to which the pattern size reduces (the degree of narrowing) differs for differing patterns even on the same substrate, resulting in a problem that resist patterns of different pattern sizes can be formed on a single substrate (namely, variation can develop in the narrowed resist pattern size).

DISCLOSURE OF INVENTION

Accordingly, an object of the present invention is to provide a method of forming a resist pattern comprising a narrowing step for narrowing the pattern size of a resist pattern using the above type of heat treatment, wherein the pattern size following the narrowing process is easily controlled and suffers minimal variation, as well as a positive resist composition used in such a method, and a layered product using such a positive resist composition.

As a result of intensive research, the inventors of the present invention believe that the cause of variations in the pattern size is the fact that the temperature dependency of the fluidity of conventional ArF resists is very high, so that when heating is conducted at a temperature near the softening point of the resist layer, even very minor variations in temperature cause the fluidity to alter, thereby causing the degree to which fluidization occurs to vary depending on the position of the resist pattern, even on a single substrate.

In other words, when heat treatment is conducted on a resist following developing in order to narrow the pattern size, it is essential that a resist pattern of uniform pattern size is formed on a single substrate, so that the hole diameters of the plurality of holes in a hole pattern are uniform, and the space width in a L&S pattern is uniform. In order to achieve this result, the pattern size preferably reduces by a constant quantity (namely, the degree of narrowing is constant) relative to the pattern size following developing (prior to the heat treatment). However, with conventional ArF resists, even very minor variations in temperature cause a variation in the degree of narrowing, meaning that reducing the pattern size for a plurality of patterns while maintaining the uniformity that existed prior to the heat treatment is difficult. Consequently, variations in the pattern sizes develop on the same substrate, leading to a poorer level of resist pattern uniformity than that prior to the heat treatment. This means that, particularly in the case of semiconductor elements with complex resist patterns, high yielding production can be very difficult.

In addition, the degree of narrowing tends to increase as the exposure dose (exposure time) increases, or as the distance between patterns (the pitch) increases, meaning the uniformity of the obtained resist pattern can deteriorate with variations in the exposure dose or due to differences in the pitch. Consequently, in the production process, consideration must be given not only to the temperature, but also to the exposure dose and the pitch, resulting in a marked tightening of the margins within the process.

In response to these types of problems, the applicants of the present invention have proposed a shrink process as one method of obtaining a fine resist pattern with good control of the pattern size (Japanese Unpublished Patent Application No. 2001-302552, Japanese Unpublished Patent Application No. 2002-080517), wherein following the formation of a resist pattern on a substrate, a water soluble resin coating is formed on top of the resist pattern, this water soluble resin coating is shrunk by subsequent heat treatment, and this heat shrinkage action is used to narrow the size of the resist pattern.

However, even in this type of method, and particularly in the case of complex resist patterns that utilize an ArF resist, satisfactory control of the pattern size sometimes proves difficult with particularly fine resist patterns.

As a result of intensive investigations aimed at resolving these issues, the inventors of the present invention discovered that by using a positive resist composition comprising, as the base resin, a resin with a structural unit derived from a (meth)acrylate ester of a specific structure, a resist pattern could be formed with excellent control of the pattern size, and were hence able to complete the present invention.

In other words, a first aspect of the present invention for resolving the above problems is a method of forming a resist pattern comprising: a resist pattern formation step, in which a positive resist composition comprising a resin component (A) that displays increased alkali solubility under the action of acid, and an acid generator component (B) that generates acid on exposure is applied to a substrate, a prebake is conducted, the resist composition is selectively exposed, post exposure baking (PEB) is conducted, and alkali developing is then used to form a resist pattern; and a narrowing step in which the pattern size of the produced resist pattern is narrowed by heat treatment, wherein the component (A) utilizes a resin with a structural unit (a1) derived from a (meth)acrylate ester represented by a general formula (I) shown below:

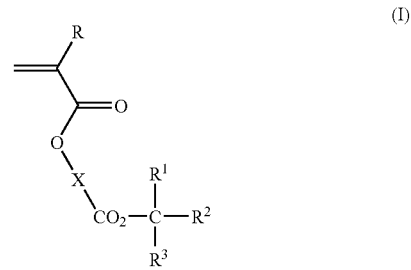

wherein, R represents a hydrogen atom or a methyl group; X represents a hydrocarbon group with 1 to 4 rings; $R^1$ to $R^3$ either each represent, independently, a lower alkyl group, or alternatively, one of $R^1$ to $R^3$ represents a lower alkyl group, and the other two groups represent lower alkylene groups, the terminals of which are bonded together to form a single ring containing 5 or 6 carbon atoms including the bonded terminal carbon atoms.

A second aspect of the present invention for resolving the above problems is a positive resist composition for use within the above method of forming a resist pattern, comprising a resin component (A) that displays increased alkali solubility under the action of acid, and an acid generator component (B) that generates acid on exposure, wherein the component (A) is a resin with a structural unit (a1) derived from a (meth)acrylate ester represented by the general formula (I) shown above.

A third aspect of the present invention for resolving the above problems is a layered product in which a resist layer formed from a positive resist composition according to the second aspect, and a water soluble resin coating comprising a water soluble polymer on the resist layer are layered onto a substrate.

In the present invention, the term "lactone unit" refers to a group in which one hydrogen atom has been removed from a monocyclic or polycyclic lactone. The term "(meth)acrylic acid" refers to acrylic acid and/or methacrylic acid. The term "(meth)acrylate" refers to acrylate and/or methacrylate. The term "structural unit" refers to a monomer unit used in producing a polymer. Furthermore, in the description that follows, a "structural unit derived from a (meth)acrylate ester" may be referred to as a "(meth)acrylate structural unit".

According to the present invention, a resist pattern with minimal pattern variation within the plane of the substrate, and excellent uniformity can be formed with good control of the pattern size.

BEST MODE FOR CARRYING OUT THE INVENTION

Figure 1A:
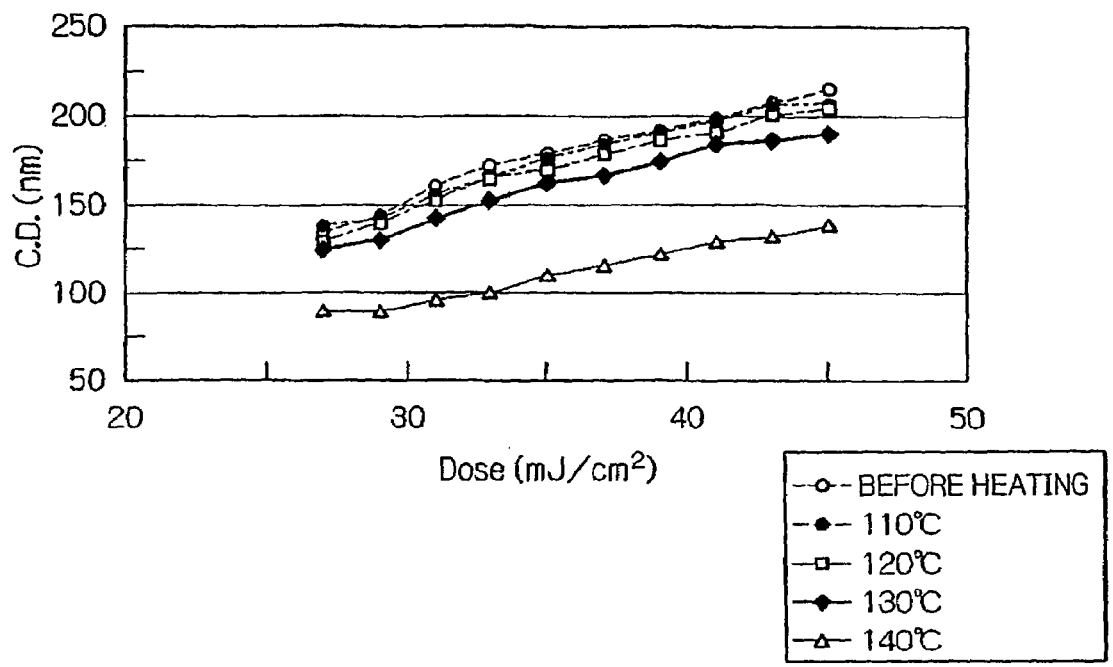
FIGS. 1A and 1B are graphs showing the variation in the hole diameter (C.D.) of a hole pattern relative to the exposure (dose), for both the situation prior to heat treatment, and the situation following heat treatment at a variety of different temperatures according to an example 1 (wherein FIG. 1A shows the results for a dense pattern, and FIG. 1B the results for an isolated pattern).

As follows is a description of embodiments of the present invention, although the present invention is in no way restricted to the examples presented below.

A characteristic of the present invention is the use of a resin comprising a structural unit (a1) derived from a (meth)acrylate ester represented by the general formula (I) shown above as the aforementioned component (A).

The reason why the present invention enables a resist pattern to be formed with good control of the pattern size is not entirely clear, although the following are considered possible reasons. Namely, during resist pattern formation, light can leak marginally into the unexposed sections at the edges of the exposed sections, and although these edge sections do not become soluble in the developing liquid, a portion of the dissolution inhibiting groups within these regions may dissociate. In recent years, halftone phase shift masks have become widely used, particularly in those cases where hole patterns are formed, in order to deal with ever finer resist patterns, and light leakage is more likely in these types of cases.

At the same time, the base resins of ArF resists use bulky groups such as adamantyl skeletons containing a tertiary carbon atom as dissolution inhibiting groups. Consequently, when a dissolution inhibiting group dissociates, the glass transition temperature (Tg) of the resin decreases considerably. As the Tg of the resin decreases, the temperature at which the resin undergoes fluidization also decreases.

Accordingly, the resist within those unexposed sections (unexposed sections A) in which a portion of the dissolution inhibiting groups have dissociated, formed as a result of slight light leakage from the edge sections of the exposed sections, are more likely to undergo softening at a lower temperature than those unexposed sections (unexposed sections B) in which none of the dissolution inhibiting groups have dissociated, and even within the unexposed sections A, the temperature at which softening starts varies depending on the proportion of the dissolution inhibiting groups that have dissociated.

Furthermore, the above types of bulky dissolution inhibiting groups function as plasticizers after dissociating, and this plasticization effect increases the flexibility of the resist, making control of the degree of narrowing even more difficult.

As a result, if a plurality of hole patterns are formed on a single substrate, and heat treatment is then conducted, the resist softens and flows into the hole patterns, reducing the hole diameter of the hole patterns, but the degree to which this inflow occurs varies depending on the position on the substrate in which the hole pattern is formed. Accordingly, even for hole patterns formed on a single substrate, it is thought that the degree of narrowing varies depending on the position on the substrate, making control of the pattern size very difficult.

In addition, as described above, this phenomenon is strongly dependent on the level of exposure and the pitch, and it is surmised that the reason for this dependency is as described below. Namely, as the exposure (dose) increases, in other words as the exposure time lengthens, larger numbers of dissolution inhibiting groups dissociate within the unexposed sections A described above, meaning the extent by which the Tg value is reduced increases, and the range of such Tg reductions widens. As a result, in the case of a hole pattern for example, the greater the exposure becomes, the more likely it is that the resist will soften. Furthermore, it is surmised that the larger the pitch (the distance between patterns) becomes, the greater the volume of resist will be between adjacent patterns, meaning the quantity of resist flowing into the hole patterns will increase, causing an increased degree of narrowing of the hole patterns.

In contrast, it is thought that in the case of a resin of the present invention, because the resin must contain the structural unit (a1) described above, and utilizes non-bulky groups as the acid dissociable, dissolution inhibiting groups, the variation in the Tg value on dissociation of a dissolution inhibiting group is minimal, meaning the degree of narrowing can be maintained at an essentially uniform level.

<<Method of Forming a Resist Pattern>>

A method of forming a resist pattern according to the present invention utilizes a positive resist composition of the present invention, comprising a resin with a specific structural unit as a resin component (A) that displays increased alkali solubility under the action of acid, and an acid generator component (B) that generates acid on exposure, and comprises the following steps.

<Resist Pattern Formation Step>

The resist pattern formation step can be conducted using a conventional resist pattern formation method, such as the method described below. Namely, a positive type resist composition such as that described below is first applied to the surface of a substrate such as a silicon wafer using a spinner or the like, and a prebake is conducted under temperature conditions of 80 to 150° C. for 40 to 120 seconds, and preferably for 60 to 90 seconds, thereby forming a resist film. Following selective exposure of the resist film with an ArF excimer laser through a desired mask pattern using, for example, an ArF exposure apparatus, PEB (post exposure baking) is conducted under temperature conditions of 80 to 150° C. for 40 to 120 seconds, and preferably for 60 to 90 seconds. Subsequently, developing is conducted using an alkali developing liquid such as an aqueous solution of tetramethylammonium hydroxide with a concentration of 0.05 to 10% by weight, and preferably from 0.05 to 3% by weight. In this manner, a resist pattern which is faithful to the mask pattern can be obtained.

An organic or inorganic anti-reflective film may also be provided between the substrate and the applied layer of the resist composition in order to improve the resolution. Furthermore, the alkali developing liquid usually employs a standard concentration of 2.38% by weight, but developing is also possible using more dilute developing liquids with a concentration within a range from 0.05 to 0.5% by weight, and the LER and the pattern shape tend to improve for concentrations within this range.

The resist film typically has a film thickness of no more than 1 μm, and is usually formed with a film thickness of 300 to 500 nm, although the increasing aspect ratios that accompany miniaturization mean that pattern collapse is becoming a significant problem for ArF excimer laser resists. One method of resolving this issue is to reduce the film thickness of the resist. However, when a thin film with a film thickness of 150 to 300 nm is formed, the pattern shape may deteriorate to some extent. In those cases in which this type of thin film is to be formed, a better pattern shape can be produced by marginally increasing the quantity of the component (B), by 2 to 3% for example, relative to the typically used quantity or the preferred quantity listed below.

[Positive Resist Composition]

The present invention utilizes a positive resist composition, which contains, as the aforementioned component (A), a resin that contains at least a structural unit (a1) derived from a (meth)acrylate ester represented by the general formula (I) shown above.

Component (A)

[Structural Unit (a1)]

The structural unit (a1) can be represented by a general formula (II) shown below.

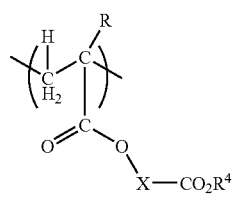

(II)

(wherein, $R^4$ is a group comprising groups $R^1$ to $R^3$ and a carbon atom bonded thereto (namely, —C(—$R^1$)(—$R^2$)—$R^3$), and R, X, and $R^1$ to $R^3$ are as described below.)

The structural unit (a1) is a unit derived from a (meth) acrylate ester, in which the carboxyl group of the (meth) acrylic acid is bonded to the group X through an ester linkage, and the group $R^4$ is bonded, via an ester linkage, to a carboxyl group bonded to a ring within the group X.

In the structural unit (a1), the group $R^4$ is an acid dissociable, dissolution inhibiting group, which displays an alkali dissolution inhibiting effect that causes the entire component (A) to be alkali insoluble prior to exposure, but dissociates under the action of acid generated from the acid generator following exposure, causing the entire component (A) to become alkali soluble.

In the aforementioned general formula (II), R represents a hydrogen atom or a methyl group, so that when R is a hydrogen atom, an acrylate structural unit is formed, whereas when R is a methyl group, a methacrylate group is formed.

The groups $R^1$ to $R^3$ are lower alkyl groups, and preferably straight chain or branched alkyl groups of 1 to 5 carbon atoms, and even more preferably 1 to 3 carbon atoms. Specific examples include methyl groups, ethyl groups, propyl groups, isopropyl groups, n-butyl groups, isobutyl groups, tert-butyl groups, pentyl groups, isopentyl groups and neopentyl groups. Alternatively, one of the groups $R^1$ to $R^3$ may be a lower alkyl group such as those described above, and the other two groups may each represent lower alkylene groups (preferably each containing from 1 to 5 carbon atoms, and even more preferably from 2 to 3 carbon atoms), the terminals of which are bonded together to form a single ring containing 5 or 6 carbon atoms including the bonded terminal carbon atoms.

For the groups $R^1$ to $R^3$, lower alkyl groups are particularly preferred, and of these, methyl groups and ethyl groups are the most preferred. In such cases, the group $R^4$ is a tertiary alkyl group such as a tert-butyl group or a tert-amyl group, and these groups dissociate in the presence of acid, and are subsequently gasified during the post exposure baking (PEB) due to their low molecular weight, and consequently do not remain in the resist. Accordingly, the type of plasticization effect described above, caused by acid dissociable, dissolution inhibiting groups, is far less likely to arise, and the degree of narrowing can be better controlled.

The group X represents a hydrocarbon group that typically contains from 1 to 4, and preferably from 2 to 4 rings, and suitable examples include groups in which 2 hydrogen atoms have been removed from a polycycloalkane such as a bicycloalkane, a tricycloalkane or a tetracycloalkane or the like.

Specific examples include groups in which 2 hydrogen atoms have been removed from a polycycloalkane such as adamantane, norbornane, isobornane, tricyclodecane or tetracyclododecane.

Of these, groups in which 2 hydrogen atoms have been removed from adamantane, groups in which 2 hydrogen atoms have been removed from norbornane, and groups in which 2 hydrogen atoms have been removed from tetracyclododecane are preferred from an industrial viewpoint.

Furthermore, the carboxyl group residues of the —$CO_2R^4$ group and the (meth)acrylate structural unit may be bonded to any position on the rings of the group X, as shown in the following formulas.

For example, in the case in which X is a group in which 2 hydrogen atoms have been removed from tetracyclododecane, the —$CO_2R^4$ group may be bonded to position 3 or 4 within the tetracyclododecane skeleton represented by the general formula shown below.

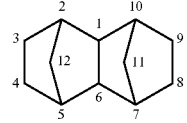

However, these bonding positions result in a mixture of stereoisomers, and so the bonding position cannot be specified. Similarly, the carboxyl group residue of the (meth)acrylate structural unit may be bonded to either position 8 or 9, although the position cannot be specified.

Furthermore, in the case in which X is a group in which 2 hydrogen atoms have been removed from adamantane, the —$CO_2R^4$ group may be bonded to position 1 or 2 within the adamantane skeleton represented by the general formula shown below.

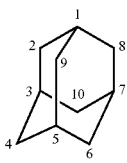

Similarly, the carboxyl group residue of the (meth)acrylate structural unit may be bonded to either position 6 or 7.

The structural unit (a1) typically accounts for 30 to 70 mol %, and preferably from 40 to 60 mol % of the total of all the structural units within the component (A). By ensuring this quantity exceeds the lower limit of the above range, the solubility of the polymer becomes more readily altered in the presence of acid, in those cases where the component (A) is used within a positive resist composition. If the quantity exceeds the upper limit of the above range, there is a danger of problems that the functions of the other structural units are not sufficiently displayed.

The component (A) may also contain any of the optional structural units (a2) to (a5) described below.

(a2): a (meth)acrylate structural unit containing a lactone unit (a3): a structural unit derived from a (meth)acrylate containing a hydroxyl group (a4): a (meth)acrylate structural unit with an acid dissociable, dissolution inhibiting group that is different from the structural unit (a1)

(a5): other structural units different from any of the structural units (a1) to (a4)

[Structural Unit (a2)]

A lactone unit, namely a group in which one hydrogen atom has been removed from a monocyclic or polycyclic lactone, is a polar group, and consequently when the component (A) is used as a positive resist composition, the structural unit (a2) is effective in increasing the adhesion between the resist film and the substrate, and improving the affinity with the developing liquid.

There are no particular restrictions on the structural unit (a2), provided it contains this type of lactone unit.

Examples of the lactone unit include groups in which one hydrogen atom has been removed from the lactones shown in the structural formulas below.

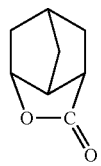 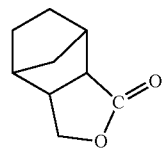

Furthermore in the structural unit (a2), the lactone unit is preferably at least one unit selected from a group consisting of compounds of the general formula (III) and the general formula (IV) shown below.

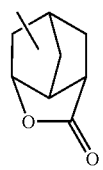

(III)

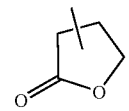

(IV)

Specific examples of the structural unit (a2) include the (meth)acrylate structural units represented by the structural formulas shown below.

[Formula 9]

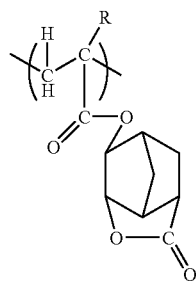

(wherein, R is a hydrogen atom or a methyl group)

[Formula 10]

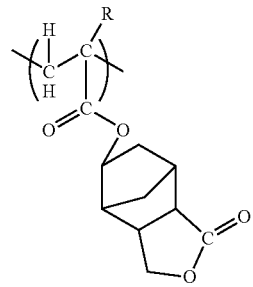

(wherein, R is a hydrogen atom or a methyl group)

[Formula 11]

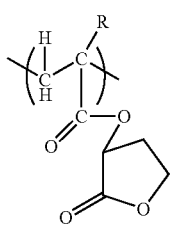

(wherein, R is a hydrogen atom or a methyl group)

[Formula 12]

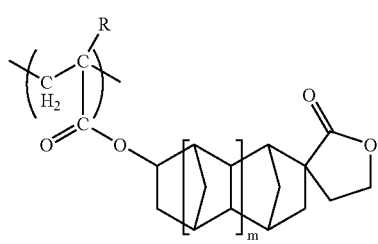

(wherein, R is a hydrogen atom or a methyl group, and m is either 0 or 1)

Of the above structural units, γ-butyrolactone esters of (meth)acrylic acid with an ester linkage at the α carbon atom (formula 11), or norbornane lactone esters (formula 9), are particularly preferred in terms of industrial availability.

The structural unit (a2) typically accounts for 20 to 60 mol %, and preferably from 30 to 50 mol % of the total of all the structural units within the component (A). By ensuring the quantity exceeds the lower limit of the above range, the adhesion can be improved, whereas if the quantity exceeds the upper limit of the above range, there is a danger of a deterioration in resolution.

[Structural Unit (a3)]

Because the structural unit (a3) contains a hydroxyl group, use of the structural unit (a3) results in an increased affinity with the developing liquid for the entire component (A), and an improvement in the alkali solubility of the exposed sections of the resist. Accordingly, the structural unit (a3) contributes to an improvement in the resolution.

The structural unit (a3) can be appropriately selected from the multitude of ArF excimer laser resist composition resins that have been proposed, and polycyclic groups containing hydroxyl groups are preferred.

Suitable examples of the polycyclic group include the various groups listed as suitable examples of the group X in the above description for the structural unit (a1).

Specifically, preferred examples of the structural unit (a3) include hydroxyl group containing adamantyl groups (in which the number of hydroxyl groups is preferably from 1 to 3, and most preferably 1), and carboxyl group containing tetracyclododecanyl groups (in which the number of carboxyl groups is from 1 to 2, and most preferably 1). Carboxyl group containing tetracyclododecanyl groups are particularly preferred.

Specifically, if the structural unit (a3) has a structure represented by a general formula (V) shown below, then the dry etching resistance improves, as does the verticalness of the pattern cross-section, both of which are desirable.

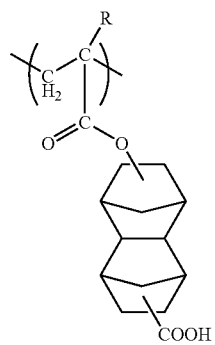

(wherein, R represents a hydrogen atom or a methyl group)

The structural unit (a3) typically accounts for 0 to 30 mol %, and preferably from 5 to 15 mol % of the total of all the structural units within the component (A). By ensuring the quantity exceeds the lower limit of the above range, the resolution can be improved, whereas if the quantity exceeds the upper limit of the above range, there is a danger that the functions of the other structural units are not sufficiently displayed.

[Structural Unit (a4)]

In the present invention, the component (A) may also contain a (meth)acrylate structural unit with an acid dissociable, dissolution inhibiting group that is different from the structural unit (a1), provided such addition does not impair the effects of the present invention. From the viewpoint of achieving maximum effect from the present invention, structural units containing acid dissociable, dissolution inhibiting groups are most preferably restricted to only the structural unit (a1).

The structural unit (a4) can be appropriately selected from the multitude of units in ArF excimer laser resist composition resins that have been proposed, although adding a structural unit containing a polycyclic acid dissociable, dissolution inhibiting group is preferred from the viewpoints of improving compression dependency and pattern shape.

Specifically, the structural unit (a4) is preferably at least one unit selected from a group consisting of the general formulas (VI) and (VII) shown below.

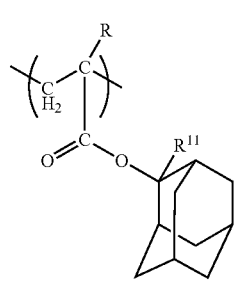

(wherein, R represents a hydrogen atom or a methyl group, and $R^{11}$ represents a lower alkyl group)

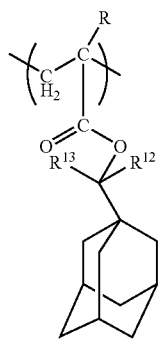

(VII)

(wherein, R represents a hydrogen atom or a methyl group, and $R^{12}$ and $R^{13}$ each represent, independently, a lower alkyl group)

The structural unit represented by the general formula (VI) is a (meth)acrylate structural unit with a hydrocarbon group bonded through an ester linkage, and by bonding a straight chain or a branched alkyl group to the carbon atom of the adamantyl group that is adjacent to the oxygen atom (—O—) of the ester function, a tertiary alkyl group is formed within the ring skeleton of the adamantyl group.

Within the above formula, the group $R^{11}$ is preferably a straight chain or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. Of these, an alkyl group of at least 2 carbon atoms, and preferably 2 to 5 carbon atoms is preferred, and in such cases, the acid dissociability tends to increase compared with the case in which $R^{11}$ is a methyl group. In terms of industrial availability, a methyl group is the most desirable.

The (meth)acrylate structural unit represented by the aforementioned general formula (VII), like the general formula (VI), is a (meth)acrylate structural unit with a bonded hydrocarbon group, although in this case, the carbon atom adjacent to the oxygen atom (—O—) of the ester function of the (meth)acrylate structural unit is a tertiary alkyl group, and a ring skeleton such as an adamantyl group exists within this tertiary alkyl group.

The groups $R^{12}$ and $R^{13}$ each preferably represent, independently, a lower alkyl group of 1 to 5 carbon atoms. These types of groups tend to display a higher acid dissociability than a 2-methyl-2-adamantyl group.

Specifically, the groups $R^{12}$ and $R^{13}$ each represent, independently, the same types of straight chain or branched lower alkyl groups described above for $R^{11}$. Of these groups, the case in which $R^{12}$ and $R^{13}$ are both methyl groups is preferred from an industrial viewpoint.

The structural unit (a4) typically accounts for no more than 30 mol %, and preferably no more than 20 mol % of the total of all the structural units within the component (A). By including the structural unit (a4), the polymer solubility can be more readily altered through the action of acid, in those cases where the component (A) is used in a positive resist composition, but if the quantity of the structural unit (a4) exceeds the upper limit of the above range, there is a danger of a deterioration in the effects of the present invention.

[Structural Unit (a5)]

There are no particular restrictions on the structural unit (a5), which can be any other structural unit that cannot be classified as one of the structural units (a1) to (a4). In other words, any structural unit that does not contain an acid dissociable, dissolution inhibiting group, a lactone or a hydroxyl group can be included as the structural unit (a5). Structural units that contain a polycyclic group and are derived from a (meth)acrylate ester are preferred. If this type of structural unit is used, then when the component (A) is used for a resist composition, the resolution for isolated patterns through to semi dense patterns (line and space patterns in which for a line width of 1, the space width is within a range from 1.2 to 2) is excellent, and consequently preferred.

Examples of the polycyclic group include the various groups listed as suitable examples of the group X in the above description for the structural unit (a1), and any of the multitude of materials conventionally used within ArF positive resist materials or KrF positive resist materials can be used.

From the viewpoint of industrial availability, at least one of a tricyclodecanyl group, an adamantyl group or a tetracyclododecanyl group are preferred.

Specific examples of the structural unit (a5) include the structures represented by the general formulas (VIII) to (X) shown below.

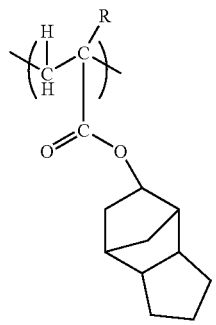

(VIII)

(wherein, R represents a hydrogen atom or a methyl group)

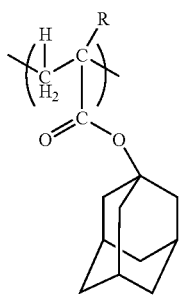

(IX)

(wherein, R represents a hydrogen atom or a methyl group)

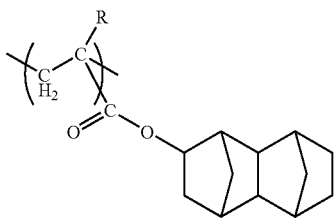

(wherein, R represents a hydrogen atom or a methyl group)

Compositions in which the structural unit (a5) accounts for 1 to 25 mol %, and preferably from 10 to 20 mol % of the total of all the structural units within the component (A) display excellent resolution for isolated patterns through to semi dense patterns, and are consequently preferred.

Amongst the different structural units of the component (A), the structural units (a2) to (a5) can be appropriately selected and combined with the structural unit (a1) in accordance with the target application. Depending on the application, other structural units may also be used in addition to the structural units from (a1) to (a5).

For example, in the case of a polymer formed from a combination of structural units with acid dissociable, dissolution inhibiting groups, namely the structural unit (a1) and an optional structural unit (a4), together with the structural unit (a2), the structural units with acid dissociable, dissolution inhibiting groups typically account for 20 to 70 mol %, and preferably from 40 to 60 mol % of the total of all the structural units, and the structural unit (a2) accounts for 30 to 80 mol %, and preferably from 40 to 60 mol %.

Furthermore, in the case of a polymer which in addition to the above components also contains the structural unit (a3), the structural units with acid dissociable, dissolution inhibiting groups typically account for 20 to 70 mol %, and preferably from 40 to 60 mol % of the total of all the structural units, the structural unit (a2) accounts for 20 to 60 mol %, and preferably from 30 to 50 mol %, and the structural unit (a3) account for 1 to 20 mol %, and preferably from 5 to 15 mol % of the total of all the structural units.

The component (A) comprises a structural unit (a1$^a$) derived from an acrylate ester and/or a structural unit (a1$^m$) derived from a methacrylate ester as the structural unit (a1).

Similarly, the other structural units (a2), (a3), (a4) and (a5) also comprise structural units derived from acrylic acid and/or methacrylic acid.

There are no particular restrictions on the weight average molecular weight (Mw) (polystyrene equivalent) of the component (A), although values within a range from 4,000 to 30,000 are preferred, and values from 7,000 to 15,000 are even more desirable. If the molecular weight is greater than this range, then there is a danger of a deterioration in the solubility of the component in the resist solvent, whereas if the molecular weight is too small, there is a danger of a deterioration in the cross sectional shape of the resist pattern.

Furthermore, there are no particular restrictions on the value of Mw/(number average molecular weight (Mn)), although values within a range from 1.0 to 6.0 are preferred, and values from 1.5 to 2.5 are even more desirable. If the value is greater than this range, the resolution and the pattern shape tend to deteriorate.

The polymer of the component (A) can be produced easily by a conventional radical polymerization of the corresponding (meth)acrylate ester monomers, using a radical polymerization initiator such as azobisisobutyronitrile (AIBN).

Component (B)

The component (B) can be appropriately selected from known materials used as acid generators in conventional chemically amplified resists.

Specific examples of the component (B) include onium salts such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

This component (B) may utilize a single compound, or a combination of two or more compounds. The quantity added is preferably selected within a range from 0.5 to 30 parts by weight, and even more preferably from 1 to 10 parts by weight per 100 parts by weight of the component (A). If the quantity is less than 0.5 parts by weight then there is a danger of the pattern formation not proceeding satisfactorily, whereas if the quantity exceeds 30 parts by weight, then achieving a uniform solution becomes difficult, and there is a danger of a deterioration in storage stability.

A resist composition of the present invention is produced by dissolving the component (A) and the component (B), together with an optional component described below, preferably in an organic solvent.

The organic solvent can be any solvent capable of dissolving the component (A) and the component (B) to generate a uniform solution, and the solvent used can be one, or two or more solvents selected from amongst known solvents used for conventional chemically amplified resists.

Specific examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or as a mixed solvent of two or more different solvents.

In particular, mixed solvents of propylene glycol monomethyl ether acetate (PGMEA) and a polar solvent containing a hydroxyl group or a lactone such as propylene glycol monomethyl ether (PGME), ethyl lactate (EL) or γ-butyrolactone offer good improvement in the storage stability of the positive resist composition, and are consequently preferred.

In those cases where EL is added, the weight ratio of PGMEA:EL is preferably within a range from 6:4 to 4:6.

In those cases in which PGME is added, the weight ratio of PGMEA:PGME is typically within a range from 8:2 to 2:8, and preferably from 8:2 to 5:5.

Mixed solvents of PGMEA and PGME improve the storage stability of the positive resist composition in those cases in which the component (A) comprises all of the structural unit (a1) and optionally structural unit (a4), the structural unit (a2), the structural unit (a3) and the structural unit (a5), and are consequently preferred.

Mixed solvents containing at least one of PGMEA and ethyl lactate, together with γ-butyrolactone are also preferred as the organic solvent. In such cases, the weight ratio of the former and latter components in the mixed solvent is preferably within a range from 70:30 to 95:5. There are no particular restrictions on the quantity of the organic solvent, although typically, a sufficient quantity of the solvent is added to produce a combined solid fraction concentration of 5 to 50% by weight, and preferably from 7 to 20% by weight, in accordance with the resist application film pressure.

In a positive resist composition of the present invention, in order to improve the resist pattern shape and the long term stability (the post exposure stability of the latent image formed by the pattern wise exposure of the resist layer), a secondary lower aliphatic amine or a tertiary lower aliphatic amine can also be added as a separate, optional component.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine and triethanolamine, and alkanolamines such as triethanolamine are preferred.

These may be used singularly, or in combinations of two or more different compounds.

These types of amines are typically added in quantities within a range from 0.01 to 1.0% by weight relative to the quantity of the component (A).

Miscible additives can also be added to a positive resist composition of the present invention according to need, including additive resins for improving the properties of the resist film, surfactants for improving the ease of application, dissolution inhibitors, plasticizers, stabilizers, colorants and halation prevention agents.

In terms of the light source used in the exposure process, although a positive resist composition of the present invention is particularly applicable to ArF excimer lasers, it is also effective for other types of radiation, including radiation of longer wavelength such as KrF excimer lasers, and radiation of shorter wavelength such as $F_2$ excimer lasers, EUV (extreme ultraviolet radiation), VUV (vacuum ultraviolet radiation), electron beams, X-rays and soft X-rays.

<Narrowing Step>

In the present invention, the narrowing step is performed following development of the resist pattern, in order to narrow the pattern size of the resist pattern.

Thermal Flow Process

One method that can be favorably used for the narrowing step is a method known as a thermal flow process.

A thermal flow process can be carried out in the manner described below. Namely, the developed resist pattern is heated at least once, and preferably 2 to 3 times, to soften the resist, and by causing the resist to flow, the pattern size of the resist pattern (such as the hole diameter within a hole pattern or the space width within a line and space pattern) is shrunk to a smaller value than that immediately following developing.

The ideal heating temperature depends on the actual composition of the positive resist composition, although there are no particular restrictions on the temperature provided it exceeds the softening point of the resist pattern. Temperatures within a range from 80 to 180° C. are preferred, and temperatures from 110 to 150° C. are even more desirable. Keeping the heating temperature within the above range offers certain advantages, including easier control of the pattern size.

Furthermore, there are no particular restrictions on the ideal heating time, and any time period that enables production of the desired pattern size without impairing throughput is suitable. In terms of application to a typical semiconductor element production line, a single heating process of 10 to 300 seconds, and preferably from 30 to 180 seconds is desirable.

Furthermore, in the case of a thermal flow process, the positive resist composition is preferably a composition containing a compound with at lest two vinyl ether groups (hereafter referred to as the component (C)), which on heating undergoes a cross linking reaction with the component (A). This type of positive resist composition offers even better control of the pattern size. It is thought that the reason for this enhanced control is that because the heating causes cross linking, which increases the Tg value of the formed resist, any reduction in the Tg value when the resist pattern undergoes softening during the heating of the narrowing step can be suppressed.

There are no particular restrictions on the component (C), provided that when the resist composition is applied to the substrate and dried to form the resist film, the component (C) undergoes cross linking with the component (A) during the heating process. Preferred examples of the component (C) include compounds in which at least 2 hydroxyl groups of either a polyoxyalkylene glycol such as an alkylene glycol, dialkylene glycol or trialkylene glycol, or a polyhydric alcohol such as trimethylolpropane, pentaerythritol or pentaglycol have been substituted with vinyl ethers.

Specific examples of such compounds include ethylene glycol divinyl ether, diethylene glycol divinyl ether, triethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether. Of these, divinyl ethers of alkylene glycols with an alicyclic group such as cyclohexanedimethanol divinyl ether are particularly preferred.

This cross linking compound with at least two vinyl ether groups of the component (C) is typically added at a rate of 0.1 to 25 parts by weight, and preferably from 1 to 15 parts by weight, per 100 parts by weight of the component (A). The component (C) may utilize either a single compound, or a mixture of two or more different compounds.

Shrink Process

Another example of an ideal process for the narrowing step is the shrink process that has been proposed by the applicants of the present invention.

In this shrink process, a resist pattern formed on a substrate is coated with a water soluble resin coating, and this water soluble resin coating is shrunk by subsequent heat treatment, and this heat shrinkage action is used to narrow the spacing in the resist pattern.

More specifically, first a coating formation agent comprising a water soluble polymer is applied to the surface of a resist pattern formed on a substrate, preferably forming a layered product in which the water soluble resin coating covers the entire surface of the resist pattern. Following application of the coating formation agent, a prebake may be conducted at a temperature of 80 to 100° C. for a period of 30 to 90 seconds. The application of the coating agent can be conducted using a known method used in the formation of conventional resist layers and the like. In other words, the aqueous solution of the coating formation agent can be applied to the substrate using a spinner or the like.

Subsequently, the thus obtained layered product is subjected to heat treatment, causing the water soluble resin coating to undergo heat shrinkage. As a result of this heat shrinkage of the water soluble resin coating, the side walls of the resist patterns adjacent to the water soluble resin coating are pulled together, thereby narrowing the spacing between patterns. This photoresist pattern spacing determines the final pattern size (the hole diameter within a hole pattern or the width within a line and space pattern), and consequently the heat shrinkage of the water soluble resin coating is able to narrow the pattern size, enabling a further miniaturization of the pattern.

The heating temperature is set to the temperature required to achieve shrinkage of the water soluble resin coating, and there are no particular restrictions on this temperature provided satisfactory narrowing of the pattern size can be achieved, although the heating is preferably conducted at a temperature that is less than the softening point of the resist pattern. Conducting the heat treatment at this type of temperature is extremely beneficial, as it enables a pattern with a good profile to be formed more effectively, and also reduces the pitch dependency of the degree of narrowing within the substrate plane, that is, the degree to which the level of narrowing is dependent on the pattern size within the substrate plane.

The "softening point" of the resist pattern refers to the temperature at which the photoresist pattern formed on the substrate begins to flow spontaneously during heat treatment of the substrate. The softening point of the resist pattern varies depending on the resist composition used to form the resist pattern. Taking into consideration the softening points of the various resist compositions used in current lithography techniques, a preferred heat treatment is typically conducted at a temperature within a range from 80 to 160° C., at a temperature that does not cause fluidization of the resist, for a period of 30 to 90 seconds.

The thickness of the water soluble resin coating is preferably either approximately equal to the height of the photoresist pattern, or of a height sufficient to cover the resist pattern, and is typically within a range from 0.1 to 0.5 μm.

Subsequently, the heat shrunk water soluble resin coating, which still remains on the pattern, is removed by washing with an aqueous solvent, and preferably with pure water, for 10 to 60 seconds. The water soluble resin coating is easily removed by washing with water, and is able to be completely removed from the substrate and the resist pattern.

There are no particular restrictions on the water soluble polymer contained within the coating formation agent used to form the water soluble resin coating, provided the polymer is soluble in water at room temperature, although resins comprising structural units derived from at least one monomer which acts as a proton donor, and structural units derived from at least one monomer which acts as a proton acceptor are ideal. By using this type of resin, volumetric shrinkage can be favorably carried out by heating.

This type of water soluble polymer may also be a copolymer comprising structural units derived from at least one monomer which acts as a proton donor, and structural units derived from at least one monomer which acts as a proton acceptor, or a mixture of a polymer with structural units derived from at least one monomer which acts as a proton donor, and a polymer with structural units derived from at least one monomer which acts as a proton acceptor, although when co-solubility is taken into consideration, a copolymer is preferred.

From an industrial viewpoint, this water soluble polymer is preferably an acrylic based polymer, a vinyl based polymer, a cellulose derivative, an alkylene glycol based polymer, a urea based polymer, a melamine based polymer, an epoxy based polymer or an amide based polymer.

Specific examples of suitable acrylic based polymers include polymers or copolymers formed from component monomers such as acrylic acid, acrylamide, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, and acryloyl morpholine.

Specific examples of suitable vinyl based polymers include polymers or copolymers formed from component monomers such as morpholine, N-vinylpyrrolidone, vinylimidazolidinone, and vinyl acetate.

Specific examples of suitable cellulose derivatives include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethylcellulose, ethylcellulose, and methylcellulose.

Specific examples of suitable alkylene glycol based polymers include addition polymers or addition copolymers of ethylene glycol or propylene glycol or the like.

Specific examples of suitable urea polymers include polymers formed from monomer components such as methylolated urea, dimethylolated urea, and ethylene urea.

Specific examples of suitable melamine polymers include polymers formed from monomer components such as methoxymethylated melamine, methoxymethylated isobutoxymethylated melamine, and methoxyethylated melamine.

In addition, water soluble epoxy based polymers and nylon based polymers can also be used.

Of the above polymers, a composition comprising at least one polymer selected from a group consisting of alkylene glycol based polymers, cellulose based polymers, vinyl based polymers and acrylic based polymers is preferred, and acrylic resins are the most preferred as they also offer simple pH adjustment. In addition, using a copolymer of an acrylic based monomer, and another non-acrylic monomer capable of forming a water soluble polymer is preferred, as such copolymers enable efficient narrowing of the photoresist pattern size, while maintaining the shape of the photoresist pattern during the heat treatment. The water soluble polymer may be either a single polymer, or a mixture of two or more polymers.

The monomer which acts as a proton donor is preferably acrylamide or N-vinylpyrrolidone.

The monomer which acts as a proton acceptor is preferably acrylic acid or the like.

A water soluble polymer comprising polymer structural units derived from N-vinylpyrrolidone as the proton donor monomer, and polymer structural units derived from acrylic acid as the proton acceptor monomer is particularly preferred.

In those cases in which the water soluble polymer utilizes a copolymer, there are no particular restrictions on the relative proportions of the structural components, although if long term stability is considered particularly important, then the proportion of the acrylic based polymer is preferably greater than that of other structural polymers. In order to improve the long term stability, in addition to increasing the proportion of the acrylic based polymer as described above, an acidic compound such as p-toluenesulfonic acid or dodecylbenzenesulfonic acid can also be added.

The coating formation agent preferably also contains a surfactant. There are no particular restrictions on the surfactant, although the surfactant should have properties such that when added to the water soluble polymer described above, the solubility is good, a suspension does not develop, and co-solubility with the polymer component is favorable. By using a surfactant that satisfies these types of characteristics, the conventional problem of defects, which are thought to be related to the occurrence of microfoam during the application of the coating material, can be more effectively prevented.

Specifically, one or more surfactants selected from a group consisting of N-alkylpyrrolidone based surfactants, quaternary ammonium salt based surfactants, and polyoxyethylene phosphate ester based surfactants is preferred.

Amongst N-alkylpyrrolidone based surfactants, compounds represented by a general formula (XI) shown below are preferred.

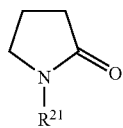
(XI)

(wherein, $R^{21}$ represents an alkyl group of 6 or more carbon atoms)

Specific examples of such N-alkylpyrrolidone based surfactants include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone, and N-octadecyl-2-pyrrolidone. Of these, N-octyl-2-pyrrolidone ("Surfadone LP100", manufactured by ISP Co., Ltd.) is preferred.

Amongst quaternary ammonium salt based surfactants, compounds represented by a general formula (XII) shown below are preferred.

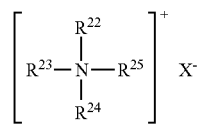
(XII)

(wherein, $R^{22}$, $R^{23}$, $R^{24}$ and $R^{25}$ each represent, independently, an alkyl group or a hydroxyalkyl group (although at least one of the groups represents an alkyl group or a hydroxyalkyl group of 6 or more carbon atoms); and $X^-$ represents a hydroxide ion or a halogen ion)

Specific examples of such quaternary ammonium salt based surfactants include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide, and octadecyltrimethylammonium hydroxide. Of these, hexadecyltrimethylammonium hydroxide is preferred.

Amongst polyoxyethylene phosphate ester based surfactants, compounds represented by a general formula (XIII) shown below are preferred.

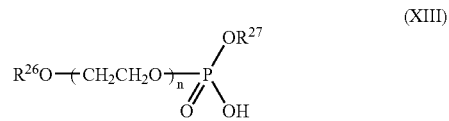
(XIII)

(wherein, $R^{26}$ represents an alkyl group or alkylallyl group of 1 to 10 carbon atoms; $R^{27}$ represents a hydrogen atom or a $(CH_2CH_2O)R^{26}$ group (wherein $R^{26}$ as is defined above); and n represents an integer from 1 to 20)

Specific examples of such polyoxyethylene phosphate ester based surfactants include "Plysurf A212E" and "Plysurf A210G", which are commercial products manufactured by Dai-ichi Kogyo Seiyaku Co., Ltd.

The quantity added of the surfactant is preferably within a range from 0.1 to 10% by weight, and even more preferably from 0.2 to 2% by weight, relative to the total solid fraction of the coating formation agent. Quantities outside the above range can cause a deterioration in the ease of application, resulting in variations in the degree of pattern shrinkage as a result of a decrease in in-plane uniformity, and an increased likelihood of defects, which are thought to be related to the occurrence of fine bubbles known as microfoam that can be generated during application of the coating material.

From the viewpoints of preventing impurities and enabling pH adjustment, the coating formation agent may also contain an optional water soluble amine.

Examples of this water soluble amine include those amines with a pKa value (acid dissociation constant) in an aqueous solution at 25° C. of 7.5 to 13. Specific examples of suitable amines include alkanolamines such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, and triisopropanolamine; polyalkylene polyamines such as diethylenetriamine, triethylenetetramine, propylenediamine, N,N-diethylethylenediamine, 1,4-butanediamine, N-ethyl-ethylenediamine, 1,2-propanediamine, 1,3-propanediamine, and 1,6-hexanediamine; aliphatic amines such as 2-ethyl-hexylamine, dioctylamine, tributylamine, tripropylamine, triallylamine, heptylamine, and cyclohexylamine; aromatic amines such as benzylamine and diphenylamine; and cyclic amines such as piperazine, N-methyl-piperazine, methyl-piperazine, and hydroxyethylpiperazine. Of these, amines with boiling points of 140° C. (760 mmHg) or higher are preferred, and monoethanolamine and triethanolamine are particularly preferred.

In those cases in which a water soluble amine is added, the quantity of the amine is preferably within a range from 0.1 to 30% by weight, and even more preferably from 2 to 15% by weight, relative to the total solid fraction of the coating formation agent. If the quantity is less than 0.1% by weight then there is a danger of a deterioration of the solution over time, whereas in contrast, if the quantity exceeds 30% by weight, there is a danger of a deterioration in the shape of the photoresist pattern.

From the viewpoints of reducing the photoresist pattern size and suppressing the occurrence of defects, an additional non-amine based water soluble organic solvent may also be added if desired.

This non-amine based water soluble organic solvent may be any non-amine based organic solvent that displays miscibility with water, and suitable examples include sulfoxides such as dimethylsulfoxide; sulfones such as dimethyl sulfone, diethyl sulfone, bis(2-hydroxyethyl) sulfone, and tetramethylene sulfone; amides such as N,N-dimethyl formamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; and polyhydric alcohols or derivatives thereof such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol, propylene glycol monomethyl ether, glycerol, 1,2-butylene glycol, 1,3-butylene glycol, and 2,3-butylene glycol. Of these, from the viewpoints of reducing the photoresist pattern size and suppressing the occurrence of defects, polyhydric alcohols or their derivatives are preferred, and glycerol is particularly preferred. This non-amine based water soluble organic solvent can utilize either a single compound, or a mixture of two or more compounds.

In those cases in which a non-amine based water soluble organic solvent is added, the quantity of the solvent is preferably within a range from 0.1 to 30% by weight, and even more preferably from 0.5 to 15% by weight, relative to the water soluble polymer. If the quantity is less than 0.1% by weight then the defect suppression effect tends to weaken, whereas in contrast, if the quantity exceeds 30% by weight, a mixing layer tends to form between the coating and the photoresist pattern, which is undesirable.

The coating formation agent is preferably used in the form of an aqueous solution with a concentration of 3 to 50% by weight, and even more preferably from 5 to 20% by weight. If the concentration is less than 3% by weight, a satisfactory coating may not be formed on the substrate, whereas at concentrations exceeding 50% by weight, not only does increasing the concentration not produce an equivalent improvement in the desired effects, but the handling of the agent also becomes more difficult.

As described above, the coating formation agent is usually used in the form of an aqueous solution using water as the solvent, although a mixed solvent of water and an alcohol based solvent could also be used. Examples of this alcohol based solvent include monovalent alcohols such as methyl alcohol, ethyl alcohol, propyl alcohol, and isopropyl alcohol. The alcohol based solvent is added to the water in quantities of no more than 30% by weight.

EXAMPLES

As follows is a more detailed description of the present invention based on a series of examples, although the present invention is in no way restricted to the examples presented below. Unless otherwise stated, quantities refer to weight % values.

Example 1

0.1 mol of a compound represented by a formula 22 shown below, 0.08 mol of the norbornane lactone acrylate of the formula 9, and 0.02 mol of a compound represented by a formula 23 shown below were dissolved in 500 ml of methyl ethyl ketone (MEK), and 0.1 mol of AIBN was then added to the solution and dissolved. The thus obtained solution was heated to a temperature of 65 to 70° C., and this temperature was maintained for 3 hours. Subsequently, the reaction solution was poured into 3 L of vigorously stirred isopropanol, and the precipitated solid was isolated by filtration. The thus obtained solid product was dissolved in 300 ml of MEK, poured into 3 L of vigorously stirred methanol, and once again the precipitated solid was isolated by filtration and then dried, and yielded a resin A (the component (A)) for which the weight average molecular weight (Mw)=6,000, Mw/(number average molecular weight (Mn))=2.0, and Tg=130° C.

[Formula 22]

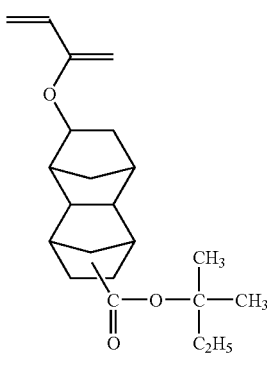

[Formula 23]

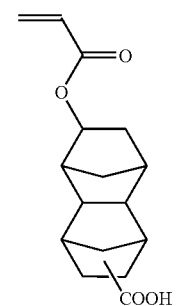

To 100 parts by weight of the thus obtained resin A were added 3.0 parts by weight of triphenylsulfonium nonafluorobutanesulfonate (the component (B)), 1.5 parts by weight of triethanolamine, and 750 parts by weight of a mixed solvent of PGMEA:EL (6:4), and following dissolution, the solution was filtered through a filter of pore size 0.45 μm, thereby completing preparation of a positive resist composition.

The thus obtained positive resist composition was applied to a silicon wafer using a spinner, and was then prebaked and dried on a hotplate at 115° C. for 90 seconds, thereby forming a resist layer with a film thickness of 300 nm.

This layer was then selectively irradiated with an ArF excimer laser (193 nm) through a mask pattern, using an ArF exposure apparatus NSR-S302 (manufactured by Nikon Corporation; NA (numerical aperture)=0.60; σ=0.75).

The resist was then subjected to PEB treatment at 115° C. for 90 seconds, subsequently subjected to puddle development for 30 seconds at 23° C. in a 2.38% by weight aqueous solution of tetramethylammonium hydroxide, and was then washed for 20 seconds with water, and dried.

As a result of this photoresist pattern formation process, a hole pattern (including a 1:1 dense pattern and a 1:3 isolated pattern) with a hole diameter of 140 nm was formed.

Next, a water soluble resin coating with a total solid fraction concentration of 8.0% by weight, which was formed by dissolving 10 g of a copolymer of acrylic acid and vinylpyrrolidone (acrylic acid:vinylpyrrolidone=2:1 (weight ratio)), and 0.02 g of "Surfadone LP100" (manufactured by ISP Co., Ltd.) as an N-alkylpyrrolidone based surfactant in pure water, was applied to the surface of the hole pattern to form a layered product. The film thickness (the height from the surface of the substrate) of the water soluble resin coating of the layered product was 200 nm. The layered product was then subjected to heat treatment for 60 seconds at a temperature of 110° C., 120° C., 130° C., or 140° C. Subsequently, the water soluble resin coating was removed by washing with pure water at 23° C.

Figure 1B:
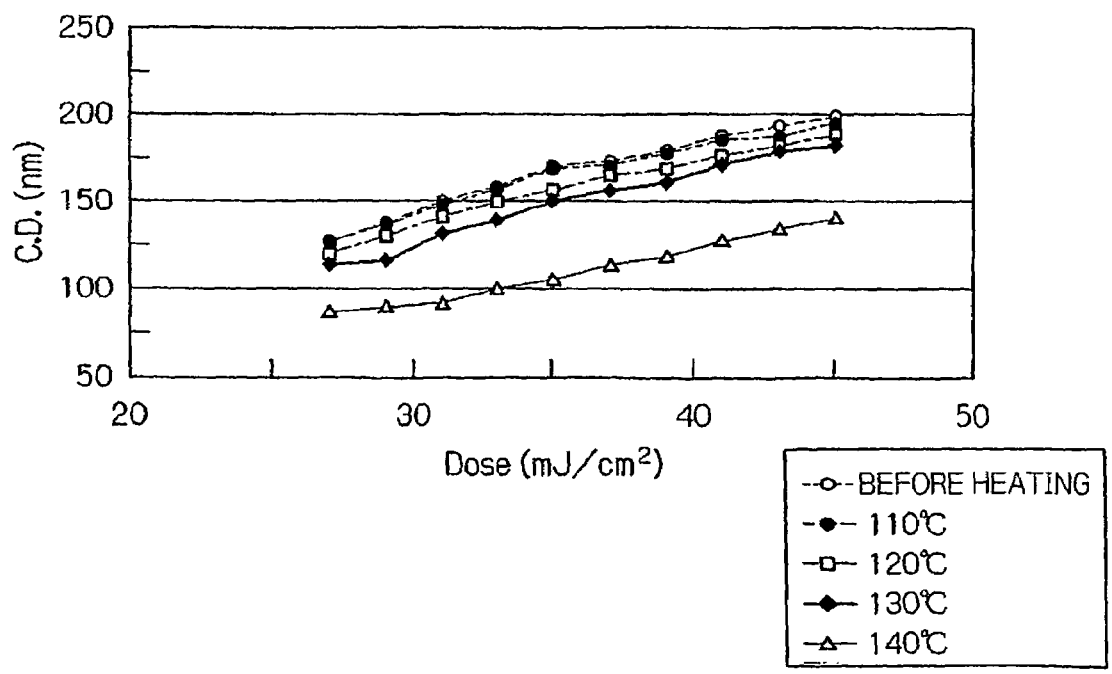

FIG. 1 shows the hole diameter values for the hole pattern prior to heat treatment, and following heat treatment at each of the different temperatures. FIG. 1A shows the results for the dense pattern, and FIG. 1B the results for the isolated pattern. The vertical axis of the graph shows the hole diameter (nm) of the produced hole pattern, and the horizontal axis shows the exposure dose (mJ/cm$^2$).

The results indicate that all of the plurality of hole patterns displayed a good shape with favorable retention of the vertical shape observed prior to the heat treatment. Furthermore, between 110° C. and 130° C., there was very little variation in the degree of narrowing regardless of the temperature, and the hole diameter reduced by substantially 20 nm from the value prior to the heat treatment Furthermore, differences in the exposure dose or the pitch also caused almost no difference in the degree of narrowing.

Comparative Example 1

With the exception of replacing the resin A from the example 1 with a resin A' comprising 2-ethyl-2-adamantyl acrylate/norbornane lactone acrylate/3-hydroxy-1-adamantyl methacrylate in a ratio of 40/40/20 (Mw=10,000, Mw/Mn=2.0, Tg=140° C.), and conducting the heat treatment at either 140° C. or 150° C., a resist pattern was formed in the same manner as the example 1.

Figure 2A:
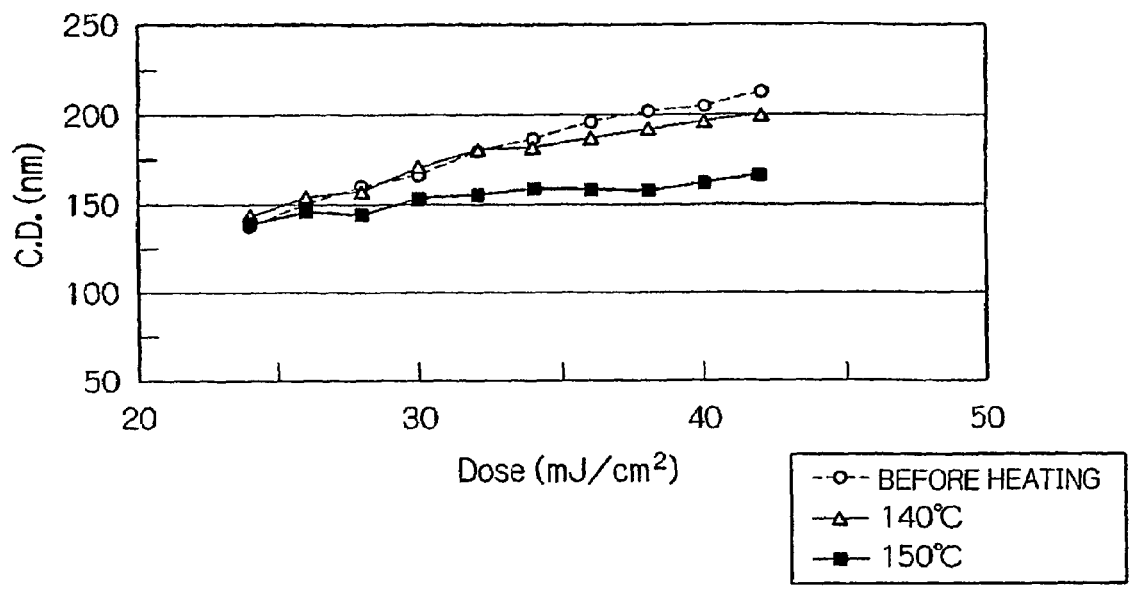
FIGS. 2A and 2B are graphs showing the variation in the hole diameter (C.D.) of a hole pattern relative to the exposure (dose), for both the situation prior to heat treatment, and the situation following heat treatment at a variety of different temperatures according to a comparative example 1 (wherein FIG. 2A shows the results for a dense pattern, and FIG. 2B the results for an isolated pattern).
Figure 2B:
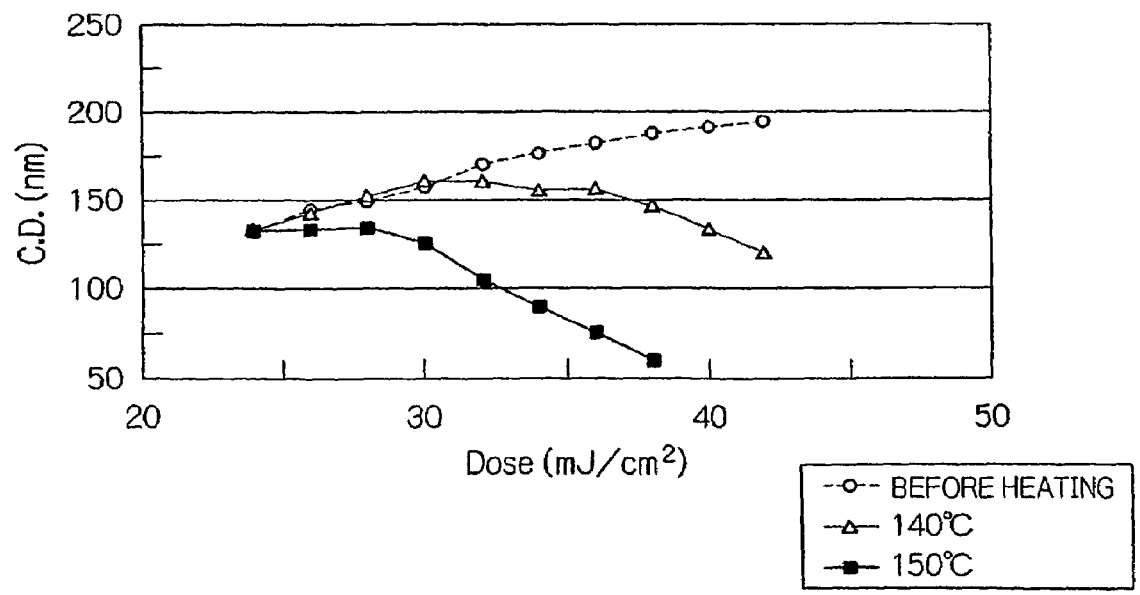

FIG. 2 shows the hole diameter values for the hole pattern prior to heat treatment, and following heat treatment at each of the temperatures. FIG. 2A shows the results for the dense pattern, and FIG. 2B the results for the isolated pattern.

The results indicate that all of the plurality of hole patterns displayed a good shape with favorable retention of the vertical shape observed prior to the heat treatment. However, there was considerable variation in the degree of narrowing, with some hole diameters remaining unchanged, and others narrowing by 80 nm or more. Furthermore, differences in the exposure dose or the pitch also caused large differences in the degree of narrowing, and even comparing values at the same temperature and the same exposure dose, the isolated pattern displayed a larger degree of narrowing than the dense pattern.

INDUSTRIAL APPLICABILITY

According to the present invention, a resist pattern with minimal pattern variation within the plane of the substrate, and excellent uniformity can be formed with good control of the pattern size, which is industrially very useful.

The invention claimed is:

1. A method of forming a resist pattern comprising: a resist pattern formation step, in which a positive resist composition comprising a resin component (A) that displays increased alkali solubility under action of acid, and an acid generator component (B) that generates acid on exposure is applied to a substrate, a prebake is conducted, said resist composition is selectively exposed, post exposure baking (PEB) is conducted, and alkali developing is used to form a resist pattern; and a narrowing step in which a pattern size of said resist pattern is narrowed by heat treatment, wherein said component (A) utilizes a resin with a structural unit (a1) derived from a (meth)acrylate ester represented by a general formula (I) shown below:

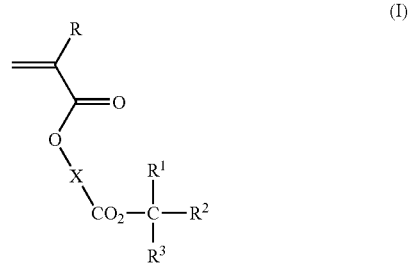

wherein, R represents a hydrogen atom or a methyl group; X represents a hydrocarbon group with 1 to 4 rings; $R^1$ to $R^3$ either each represent, independently, a lower alkyl group, or alternatively, one of $R^1$ to $R^3$ represents a lower alkyl group, and two remaining groups represent lower alkylene groups, terminals of which are bonded together to form a single ring containing 5 or 6 carbon atoms including bonded terminal carbon atoms.

2. A method of forming a resist pattern according to claim 1, wherein said component (A) utilizes a resin with a structural unit (a1) in which said groups $R^1$ to $R^3$ each represent, independently, a lower alkyl group.

3. A method of forming a resist pattern according to claim 2, wherein said component (A) utilizes a resin with a structural unit (a1) in which said lower alkyl groups are either methyl groups or ethyl groups.

4. A method of forming a resist pattern according to claim 1, wherein said component (A) utilizes a resin further comprising a structural unit (a2) derived from a (meth)acrylate ester with a lactone unit.

5. A method of forming a resist pattern according to claim 1, wherein said component (B) utilizes an onium salt with a fluorinated alkylsulfonate ion as an anion.

6. A method of forming a resist pattern according to claim 1, wherein said positive resist composition further comprises a secondary or a tertiary lower aliphatic amine.

7. A method of forming a resist pattern according to claim 1, wherein said narrowing step is a thermal flow process in which said resist pattern is heated and softened, and a pattern size of said resist pattern is narrowed.

8. A method of forming a resist pattern according to claim 7, wherein said positive resist composition further comprises a compound with at least two vinyl ether groups, which reacts with said resin component (A) on heating and forms cross linking.

9. A method of forming a resist pattern according to claim 1, wherein said narrowing step is a shrink process, in which a water soluble resin coating comprising a water soluble polymer is provided on top of said resist pattern, and subsequently heated, causing said water soluble resin coating to shrink, thereby narrowing a spacing of said resist pattern.

10. A method of forming a resist pattern according to claim 9, wherein said water soluble polymer utilizes a polymer comprising a structural unit derived from at least one monomer which acts as a proton donor, and a structural unit derived from at least one monomer which acts as a proton acceptor.

11. A method of forming a resist pattern according to claim 10, wherein said water soluble polymer is at least one polymer selected from a group consisting of acrylic based polymers, vinyl based polymers, cellulose based derivatives, alkylene glycol based polymers, urea based polymers, melamine based polymers, epoxy based polymers, and amide based polymers.

12. A method of forming a resist pattern according to claim 9, wherein said water soluble resin coating further comprises a water soluble amine andlor a surfactant.

13. A positive resist composition for use within a method of forming a resist pattern according to claim 1, comprising a resin component (A) that displays increased alkali solubility under action of acid, and an acid generator component (B) that generates acid on exposure, wherein said component (A) is a resin with a structural unit (a1) derived from a (meth)acrylate ester represented by a general formula (I) shown below:

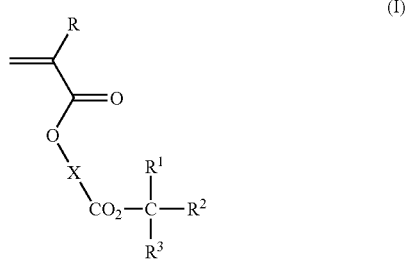

(I)

wherein, R represents a hydrogen atom or a methyl group; X represents a hydrocarbon group with 1 to 4 rings; $R^1$ to $R^3$ either each represent, independently, a lower alkyl group, or alternatively, one of $R^1$ to $R^3$ represents a lower alkyl group, and two remaining groups represent lower alkylene groups, terminals of which are bonded together to form a single ring containing 5 or 6 carbon atoms including bonded terminal carbon atoms.

14. A layered product in which a resist layer formed from a positive resist composition according to claim 13, and a water soluble resin coating comprising a water soluble polymer on the resist layer are layered onto a substrate.

15. A positive resist composition comprising a resin component (A) capable of displaying increased alkali solubility under action of acid, and an acid generator component (B) capable of generating acid on exposure, wherein the resin component (A) contains a resin having a structural unit (a1) derived from a (meth)acrylate ester of general formula (I):

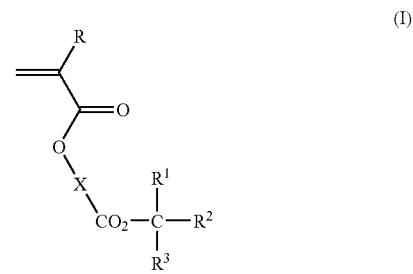

(I)

wherein, R represents a hydrogen atom or a methyl group; X represents a hydrocarbon group with 1 to 4 rings; $R^1$ to $R^3$ either each represent, independently, a lower alkyl group, or alternatively, one of $R^1$ to $R^3$ represents a lower alkyl group, and two remaining groups represent lower alkylene groups, terminals of which are bonded together to form a single ring containing 5 or 6 carbon atoms including bonded terminal carbon atoms.

16. A method of forming a resist pattern comprising:

applying the positive resist composition of claim 15 to a substrate;

conducting pre-baking of the substrate with the positive resist composition;

selectively exposing the resist composition;

conducting post exposure baking of the substrate with the selectively exposed resist composition; and forming by alkali developing a resist pattern using the post exposure baked resist composition; and narrowing a pattern size of the resist pattern by heat treatment.

* * * * *